United States Patent
Contreras et al.

(10) Patent No.: US 8,351,155 B2
(45) Date of Patent: *Jan. 8, 2013

(54) PERPENDICULAR MAGNETIC RECORDING SYSTEM WITH SPIN TORQUE OSCILLATOR AND CONTROL CIRCUITRY FOR FAST SWITCHING OF WRITE POLE MAGNETIZATION

(75) Inventors: John Thomas Contreras, Palo Alto, CA (US); Manfred Ernst Schabes, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 673 days.

This patent is subject to a terminal disclaimer.

(21) Appl. No.: 12/542,682

(22) Filed: Aug. 17, 2009

(65) Prior Publication Data

US 2011/0038081 A1    Feb. 17, 2011

(51) Int. Cl.
*G11B 5/127* (2006.01)
(52) U.S. Cl. .................................... 360/125.3
(58) Field of Classification Search .............. None
See application file for complete search history.

(56) References Cited

U.S. PATENT DOCUMENTS

| | | | |
|---|---|---|---|
| 5,661,612 A | 8/1997 | Hasegawa et al. | |
| 5,869,988 A | 2/1999 | Jusuf et al. | |
| 6,219,193 B1 | 4/2001 | Janz | |
| 6,349,009 B1 | 2/2002 | Dakroub et al. | |
| 6,775,099 B2 | 8/2004 | Kuroda et al. | |
| 6,785,092 B2 | 8/2004 | Covington et al. | |
| 6,816,339 B1 | 11/2004 | Litvinov et al. | |
| 6,913,704 B2 | 7/2005 | Hsiao et al. | |
| 6,954,331 B2 | 10/2005 | Crawford et al. | |
| 7,002,775 B2 | 2/2006 | Hsu et al. | |
| 7,070,716 B2 | 7/2006 | Lam | |
| 7,072,142 B2 | 7/2006 | Lam | |
| 7,237,320 B2 | 7/2007 | Lam | |
| 7,256,955 B2 | 8/2007 | Pokhil et al. | |

(Continued)

FOREIGN PATENT DOCUMENTS

JP    59060722 A1    4/1984

(Continued)

OTHER PUBLICATIONS

Zhu, J. G. et al., "Microwave assisted recording", IEEE Trans. Mag. (2008), pp. 125-131.

(Continued)

*Primary Examiner* — David D Davis
(74) *Attorney, Agent, or Firm* — Thomas R. Berthold

(57) ABSTRACT

A perpendicular magnetic recording hard disk drive includes a write head with a write pole and an electrically conductive coil coupled to the write pole, a write driver for supplying electrical write current to the coil to generate magnetic flux in the write pole, a spin torque oscillator (STO) that injects auxiliary magnetic flux to the write pole to facilitate magnetization switching of the write pole, and STO control circuitry. Direct electrical current to the STO induces rotation of the magnetization of a free ferromagnetic layer in the STO, which generates the auxiliary magnetic flux. The STO control circuitry may be coupled to the STO via the electrical lines that connect the write driver to the write head, the lines that connect the read amplifier to the read head, or, if the disk drive is one with thermal fly-height control (TFC), the lines that connect the TFC circuitry with the heater.

9 Claims, 12 Drawing Sheets

U.S. PATENT DOCUMENTS

| | | | |
|---|---|---|---|
| 7,397,633 B2 | 7/2008 | Xue et al. | |
| 7,957,098 B2 * | 6/2011 | Yamada et al. | 360/125.3 |
| 2002/0030928 A1 | 3/2002 | Hsiao et al. | |
| 2006/0054699 A1 | 3/2006 | Osterweil | |
| 2007/0253106 A1 | 11/2007 | Sato et al. | |
| 2008/0019040 A1 | 1/2008 | Zhu et al. | |
| 2008/0112078 A1 | 5/2008 | Hsiao et al. | |
| 2008/0112080 A1 | 5/2008 | Lengsfield et al. | |
| 2008/0112087 A1 | 5/2008 | Clinton et al. | |
| 2008/0117545 A1 | 5/2008 | Batra et al. | |
| 2008/0137224 A1 | 6/2008 | Gao et al. | |
| 2008/0151436 A1 | 6/2008 | Sato et al. | |
| 2008/0186628 A1 | 8/2008 | Hsiao et al. | |
| 2008/0273268 A1 | 11/2008 | Hsiao et al. | |
| 2009/0059418 A1 | 3/2009 | Takeo et al. | |
| 2009/0059423 A1 * | 3/2009 | Yamada et al. | 360/122 |
| 2009/0225465 A1 * | 9/2009 | Iwasaki et al. | 360/75 |

FOREIGN PATENT DOCUMENTS

| | | |
|---|---|---|
| JP | 2001202601 A1 | 7/2001 |
| JP | 2004227709 A1 | 8/2004 |

OTHER PUBLICATIONS

Kittel C., "On the Theory of Ferromagnetic Resonance Absorption", Phys. Rev. 73, p. 155-161 (1948).

Kahng, A.B. et al., "Fill for Shallow Trench Isolation CMP", Computer-Aided Design, 2006. ICCAD '06. IEEE/ACM International Conference on Nov. 5-9, 2006 pp. 661-668.

Zhu, X. et al., "Bias-Field-Free Microwave Oscillator Driven by Perpendicularly Polarized Spin Current", IEEE Transactions on Magnetics, vol. 42, No. 10, Oct. 2006, pp. 2670-2672.

* cited by examiner

PERPENDICULAR MAGNETIC RECORDING SYSTEM WITH SPIN TORQUE OSCILLATOR AND CONTROL CIRCUITRY FOR FAST SWITCHING OF WRITE POLE MAGNETIZATION

RELATED APPLICATION

This application is related to concurrently filed application Ser. No. 12/542,677 titled "PERPENDICULAR MAGNETIC RECORDING WRITE HEAD WITH SPIN TORQUE OSCILLATOR FOR FAST SWITCHING OF WRITE POLE MAGNETIZATION".

BACKGROUND OF THE INVENTION

1. Field of the Invention

This invention relates generally to perpendicular magnetic recording systems, and more particularly to a system with fast switching of the magnetization direction of the perpendicular write head.

2. Description of the Related Art

Perpendicular magnetic recording, wherein the recorded bits are stored in a perpendicular or out-of-plane orientation in the recording layer, allows for ultra-high recording densities in magnetic recording hard disk drives. The write head must be able to write data not only at high bit-density but also at high data-rates. The write speed is particularly important in enterprise disk drives. However, the switching time for the write pole of the write head to switch from one magnetization direction to the other is a limiting factor as the data rate is increased. At high data-rates, the available magnetic flux from the write head, as seen by the recording layer on the disk, is dominated by the low-frequency flux output of the write head. The reason for such loss of write flux includes a slow intrinsic time-constant of the magnetization reversal in the main pole of the write head. Also, lower data-rate systems still require additional overshoot of the write current from the disk drive's write driver circuitry to aid in the magnetization reversal. This additional overshoot requires additional power from the write driver circuitry.

Perpendicular magnetic recording systems with high-frequency assisted writing using a spin-torque oscillator have been proposed. In these proposed systems, the write head with perpendicular write pole generates the perpendicular write field to the magnetic recording layer and a spin-torque oscillator generates a high-frequency auxiliary field to the recording layer. The auxiliary field may have a frequency close to the resonance frequency of the magnetic grains in the recording layer to facilitate the switching of the magnetization of the grains. These types of systems that use a spin-torque oscillator to apply a high-frequency field to the recording layer to assist writing by the perpendicular write head are described in U.S. Pat. No. 6,785,092 B2; US 2008/0137224 A1; and by J. G. Zhu et al., "Microwave Assisted Magnetic Recording", *IEEE Transactions on Magnetics*, Vol. 44, No. 1, January 2008, pp. 125-131. However, these systems do not increase the switching speed of the magnetization of the perpendicular write pole.

Pending application Ser. No. 12/419,278 filed Apr. 6, 2009 and assigned to the same assignee as this application discloses a perpendicular magnetic recording system with an auxiliary coil and auxiliary pole that injects magnetic flux into the write pole at an angle to the primary or perpendicular axis of the write pole. The additional flux from the auxiliary pole, which is injected non-parallel to the primary magnetization of the write pole, exerts a torque on the magnetization of the write pole, thereby facilitating magnetization reversal of the write pole.

Thus for both high data-rate and lower data-rate perpendicular magnetic recording, what is needed is a write head and system that reduces the magnetization reversal time of the write pole and overshoot for the write pole without the application of a high-frequency auxiliary field to the recording layer and without the need for an auxiliary coil.

SUMMARY OF THE INVENTION

The invention relates to a perpendicular magnetic recording system, such as a hard disk drive, that has a disk with a magnetic recording layer, a read head and read amplifier, a write head with a write pole and an electrically conductive coil coupled to the write pole, a write driver for supplying electrical write current to the coil to generate magnetic flux in the write pole, a spin torque oscillator (STO) that injects auxiliary magnetic flux to the write pole to facilitate magnetization switching of the write pole, and STO control circuitry. The STO comprises a stack of layers including electrodes, a pinned ferromagnetic layer having a magnetization fixed in the presence of a direct electrical current between the electrodes, a free ferromagnetic layer having a magnetization free to rotate in the presence of a direct electrical current between the electrodes, and a nonmagnetic spacer layer between the pinned and free layers. The STO control circuitry supplies direct electrical current to the STO electrodes when write current is supplied to the coil by the write driver. The STO direct current is supplied with a current density above a critical value to induce a spin torque on the magnetization of the free layer. The rotation of the magnetization of the free layer generates auxiliary magnetic flux which is directed substantially orthogonal to the write pole to facilitate magnetization switching of the write pole.

In a first embodiment, the STO control circuitry may be coupled to the STO via the same electrical lines or traces that connect the write driver to the write head to thereby avoid the necessity for separate interconnect lines. A pair of matched resistors are located between the write driver and the write head. The STO direct current is generated by a low-frequency voltage source that does not inhibit the high-frequency signals of the STO. The STO control circuitry operates by sensing the common-mode through the resistors, which are closely matched in resistance and high in value, such that a very small amount of the write current signal is shunted away from the signal path. The common-mode voltage is filtered by a low-pass filter and compared with the source voltage at a comparator.

In a second embodiment, the STO control circuitry may be coupled to the STO via the same electrical lines or traces that connect the read amplifier to the read head, and the STO control circuitry operates in a manner similar to that for the first embodiment. In a third embodiment, if the disk drive is the type that has thermal fly-height control (TFC), then the STO direct current is supplied through the electrical lines that connect the TFC circuitry with the heater, and the STO control circuitry applies the source voltage on the low line of the TFC bias line.

For a fuller understanding of the nature and advantages of the present invention, reference should be made to the following detailed description taken together with the accompanying figures.

DETAILED DESCRIPTION OF THE INVENTION

Figure 1:
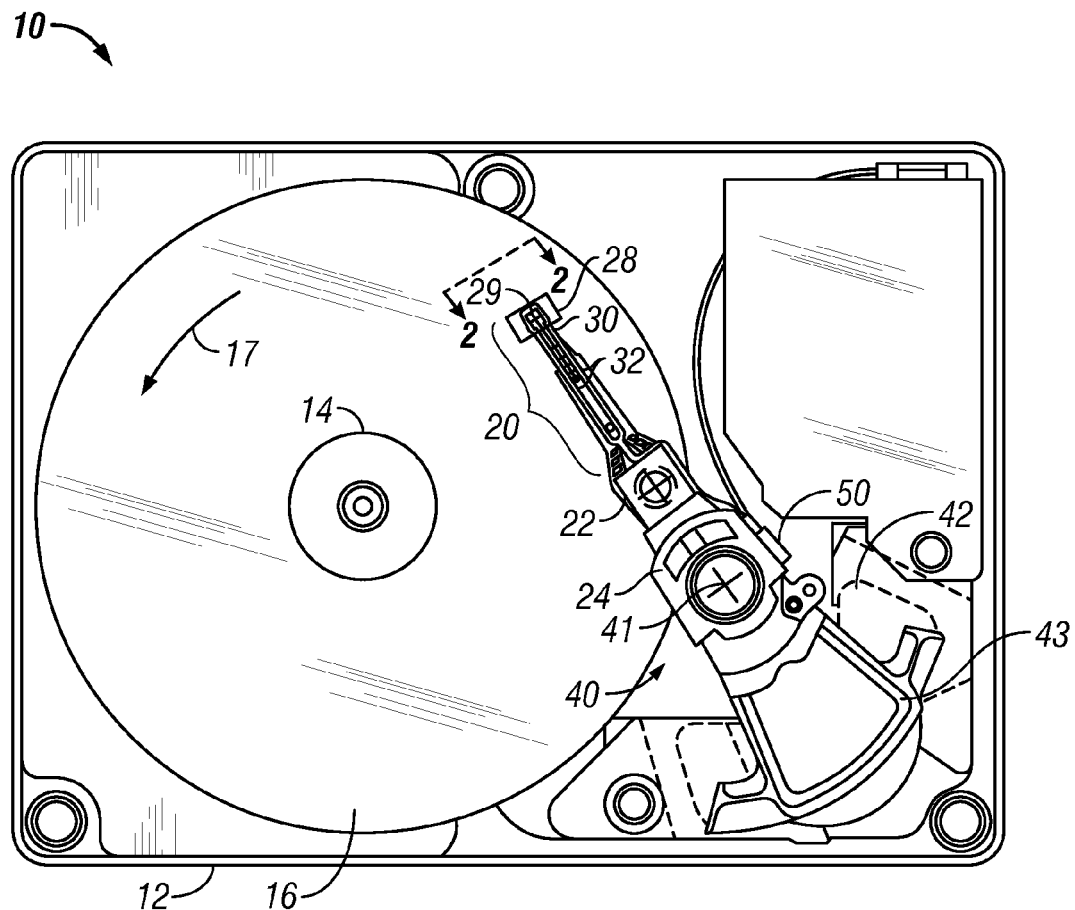
FIG. 1 is a top plan view of a head/disk assembly of a hard disk drive.

FIG. 1 is a top plan view of a head/disk assembly of a hard disk drive 10 with the cover removed. The disk drive 10 includes a rigid base 12 supporting a spindle 14 that supports a stack of disks, including top disk 16. The spindle 14 is rotated by a spindle motor (not shown) for rotating the disks in the direction shown by curved arrow 17. The hard disk drive 10 has at least one load beam assembly 20 having an integrated lead suspension (ILS) or flexure 30 with an array 32 of electrically conductive interconnect traces or lines. The load beam assemblies 20 are attached to rigid arms 22 connected to an E-shaped support structure, sometimes called an E-block 24. Each flexure 30 is attached to an air-bearing slider 28. A magnetic recording read/write head 29 is located at the end or trailing surface 25 of slider 28. The flexure 30 enables the slider 28 to "pitch" and "roll" on an air-bearing generated by the rotating disk 16. Disk drive 10 also includes a rotary actuator assembly 40 rotationally mounted to the rigid base 12 at a pivot point 41. The actuator assembly 40 is a voice coil motor (VCM) actuator that includes a magnet assembly 42 fixed to base 12 and a voice coil 43. When energized by control circuitry (not shown) the voice coil 43 moves and thereby rotates E-block 24 with attached arms 22 and load beam assemblies 20 to position the read/write heads 29 to the data tracks on the disks. The trace interconnect array 32 connects at one end to the read/write head 29 and at its other end to read/write circuitry contained in an electrical module or chip 50 secured to a side of the E-block 24. The chip 50 includes a read preamplifier and a write driver circuit.

Figure 2:
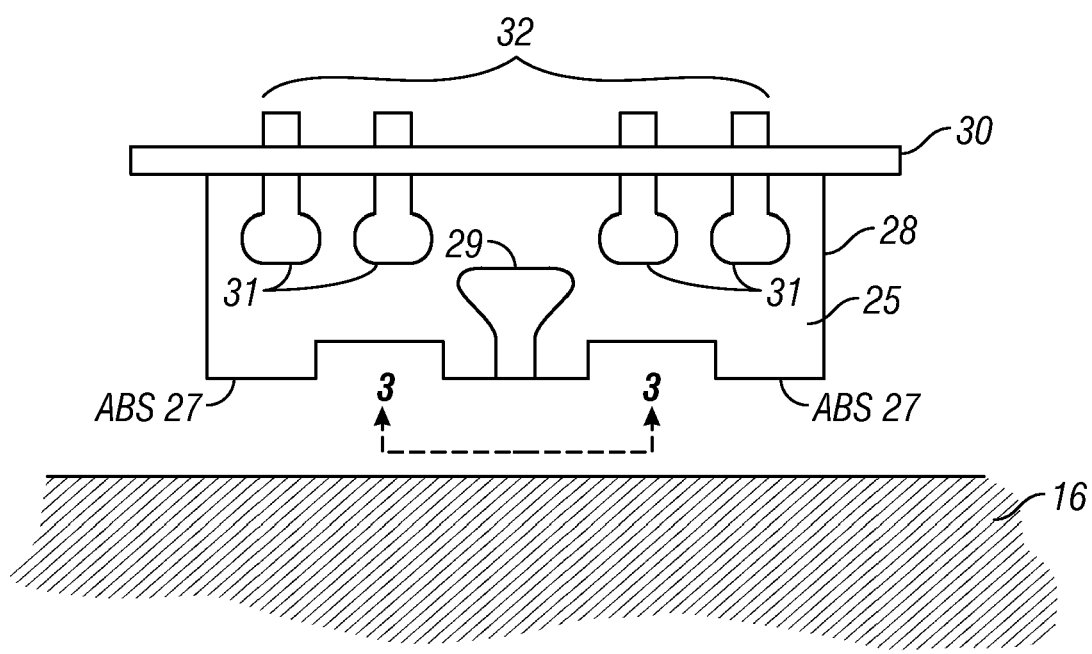
FIG. 2 is an enlarged end view of the slider and a section of the disk taken in the direction 2-2 in FIG. 1.

FIG. 2 is an enlarged end view of the slider 28 and a section of the disk 16 taken in the direction 2-2 in FIG. 1. The slider 28 is attached to flexure 30 and has an air-bearing surface (ABS) 27 facing the disk 16 and an end or trailing surface 25 generally perpendicular to the ABS 27. The ABS 27 causes the airflow from the rotating disk 16 to generate a bearing of air that supports the slider 28 in very close proximity to or near contact with the surface of disk 16. The read/write head 29 is formed as a series of thin films deposited on the slider 28 on its trailing surface 25. Typically a layer of insulating material, like alumina, is deposited over the read/write head 29 and serves as the outer surface of slider 28. The read/write head 29 is connected to terminal pads 31. The terminal pads 31 connect to the trace array 32 on flexure 30 for electrical connection to the read preamplifier and write driver in chip 50 (FIG. 1).

Figure 3:
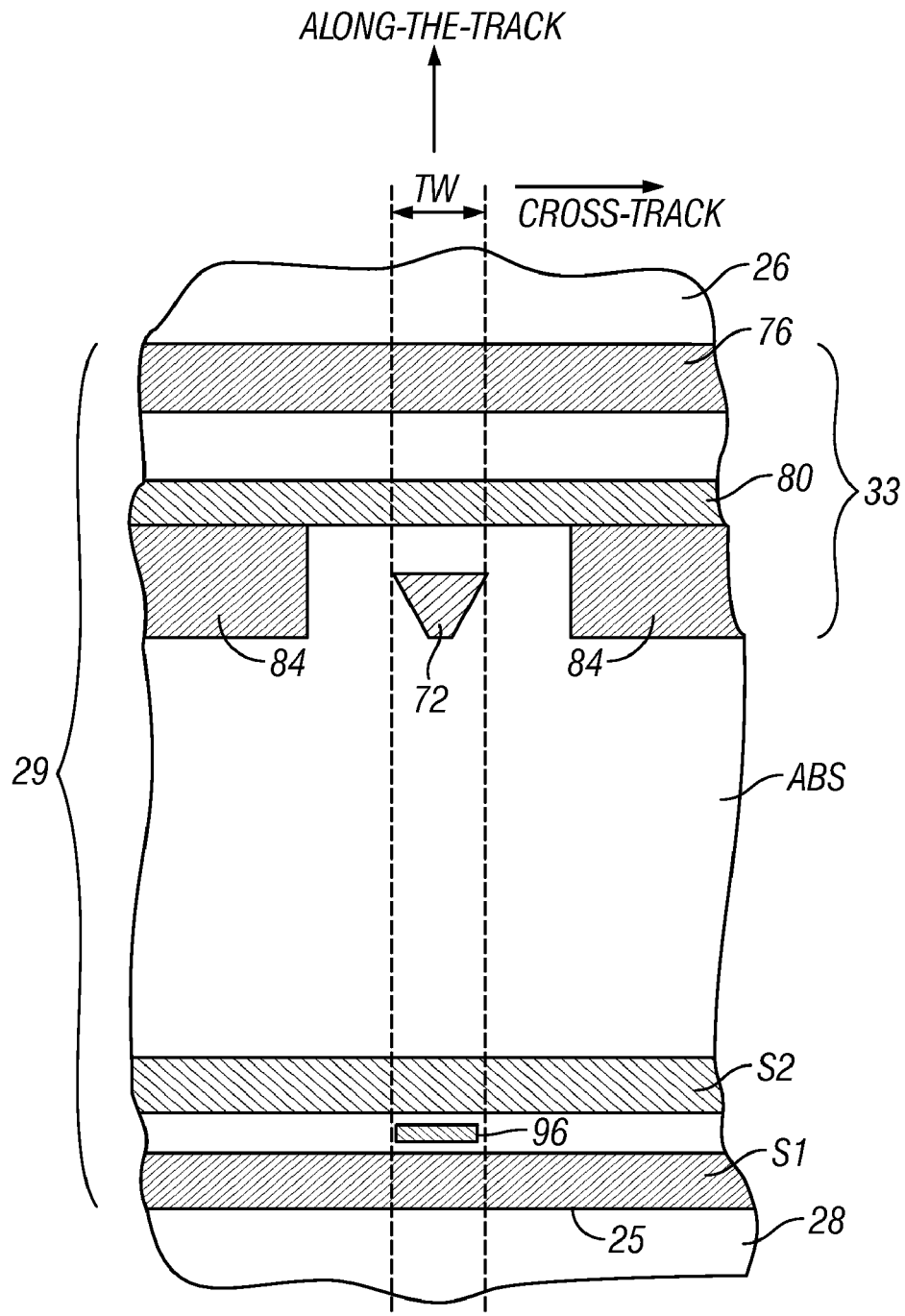
FIG. 3 is a view in the direction 3-3 of FIG. 2 and shows the ends of the read/write head as viewed from the disk.

FIG. 3 is a view in the direction 3-3 of FIG. 2 and shows the ends of read/write head 29 as viewed from the disk 16. The read/write head 29 includes a read head 96 and a write head 33 that are formed as a series of thin films deposited and lithographically patterned on the trailing surface 25 of slider 28, with the films of the read head being deposited first and the films of the write head being deposited over the read head. The magnetoresistive read sensor or head 96 is located between two magnetic shields S1 and S2, with first shield S1 being located on trailing surface 25. The write head 33 has a perpendicular write head and includes magnetic write pole (WP) with WP tip 72 and flux return pole 76. The WP tip 72 may be generally surrounded at the ABS by optional side shields 84 and trailing shield 80. The trailing shield 80 and side shields 84 may be connected to form a wraparound shield (WAS). The WAS is described in detail as a shield for a conventional perpendicular recording head in U.S. Pat. No. 7,002,775 B2 assigned to the same assignee as this application. The WAS, which is separated from the WP tip 72 by nonmagnetic gap material, alters the angle of the write field and improves the write field gradient at the point of writing, and also shields the writing field at regions of the disk away from the track being written. The shields S1, S2 for the read head 96 and the shields 80, 84 for the WP tip 72 are formed of magnetically permeable material. A layer of insulating material, like alumina, is deposited over the write head 33, resulting in an outer surface 26. The width of the WP tip 72 and the read head 96 in the cross-track direction correspond generally to the trackwidth (TW) of the data tracks on the disk 16.

Figures 4A, 4B:
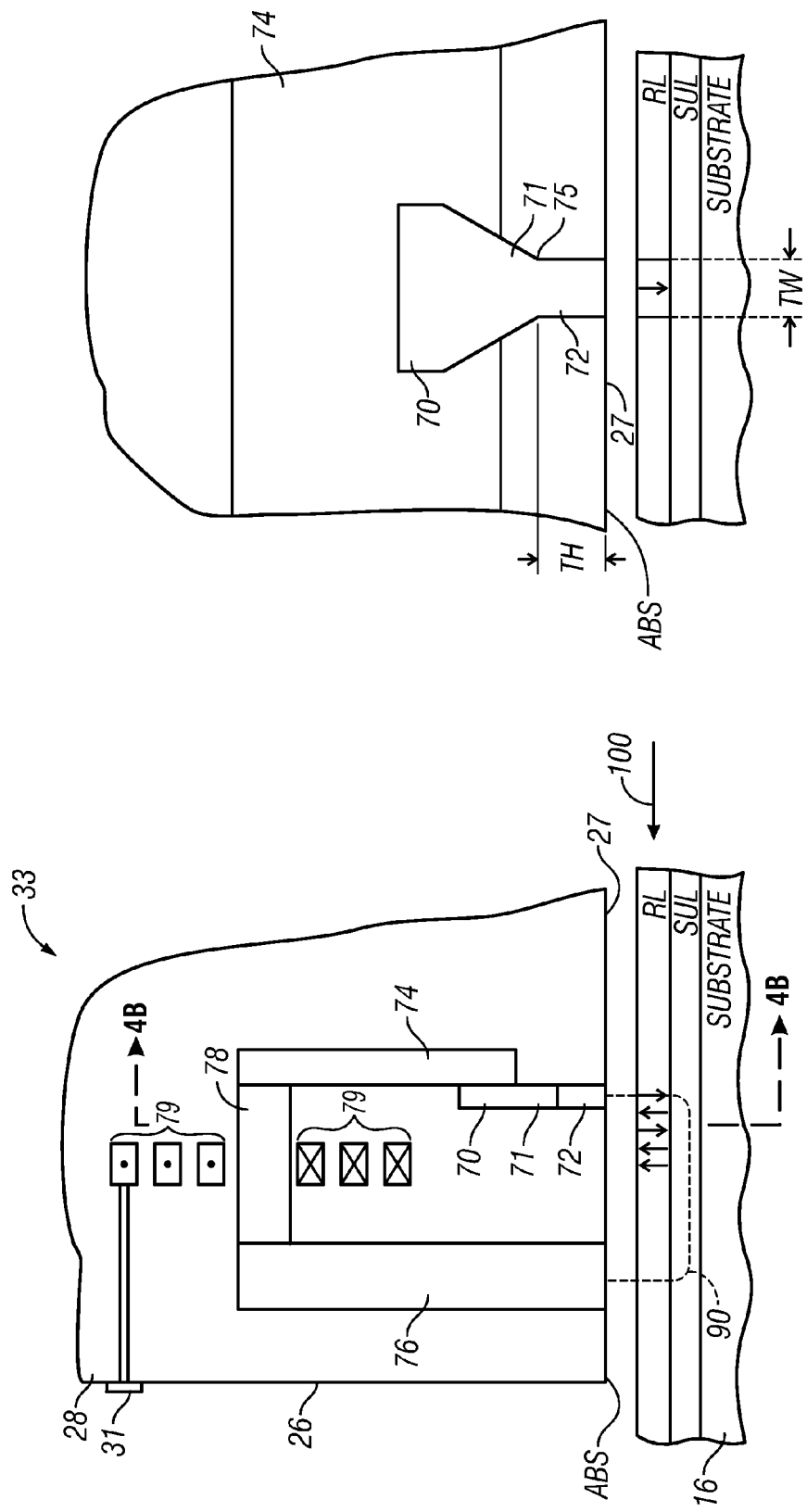
FIG. 4A is a sectional view of a portion of a slider showing a prior art perpendicular write head with a pancake coil and a portion of a perpendicular magnetic recording disk.
FIG. 4B is a view in the direction 4B-4B of FIG. 4A and illustrates the flare region of the flared write pole for the perpendicular write head.

FIG. 4A is a sectional view of a portion of slider 28 showing the perpendicular write head 33 and a portion of a perpendicular magnetic recording disk 16. The disk 16 includes a perpendicular magnetic data recording layer (RL) on a "soft" or relatively low-coercivity magnetically permeable underlayer (SUL) formed on the disk substrate. The write head 33 includes a yoke made up of the main pole 74, flux return pole 76, and yoke stud 78 connecting the main pole 74 and flux return pole 76; and a thin film "pancake" coil 79 shown as sections wrapped around yoke stud 78. The return pole 76 and yoke stud 78 are formed of soft ferromagnetic material, such as alloys of NiFe, CoFe and NiFeCo that are typically formed by electroplating. The write head 33 in FIG.

4A is depicted without the optional WAS (FIG. 3). The coil 79 is connected to terminals, such as terminal 31, on the outer surface 26 of slider 28. A flared write pole (WP) 70 is part of the main pole 74 and has a flared portion 71 and a pole tip 72 that faces the surface of disk 16. The WP 70 is formed of a high-moment material, such as a high-moment CoFe alloy, that is typically formed by sputter deposition, and may be a laminated structure. Write current through the thin film coil 79 induces a magnetic field (shown by dashed line 90) from the flared WP 70 that passes through the data RL (to magnetize the region of the RL beneath the WP 70), through the flux return path provided by the SUL, and back to the return pole 76. The slider 28 has its air-bearing surface (ABS) 27 supported above the surface of disk 16 as the disk 16 moves past the write head 33 in the direction indicated by arrow 100. The RL is illustrated with a perpendicularly recorded or magnetized region representing data adjacent to the pole tip 72. Preceding regions are shown having random prerecorded magnetization directions, as represented by the arrows. The magnetic transitions are detectable by the read head (not shown in FIG. 4A) as the recorded bits. The write coil 79 is called a "pancake" coil because it is deposited and patterned on the trailing end of the slider as essentially a single layer and thus all of the coil turns lie in substantially the same plane. When write current from the write driver in chip 50 (FIG. 1) is directed to coil 79 in one direction, for example in FIG. 4A out of the paper in the upper coil sections 79 with dots and into the paper in the lower coil sections 79 with the Xs, the region of the RL beneath the WP tip 72 is magnetized in one direction, down or into the disk in FIG. 4A. When the write driver switches the direction of the write current to coil 79, the region of the RL beneath the WP tip 72 is magnetized in the opposite direction, i.e., up or out of the disk in FIG. 4A.

FIG. 4B is a view in the direction 4B-4B of FIG. 4A and illustrates the flare region 71 of the flared WP 70. The region between the WP tip 72 and the flare portion 71 is called the flare point 75. The flare point 75 of the WP 70 is sometimes referred to as the "choke" point because it is the point where the flux density is highest and where the WP 70 saturates. The WP tip 72 has its primary or perpendicular axis oriented perpendicular to the ABS and has a "height" or distance from the ABS to flare point 75 called the throat height (TH). As shown in FIG. 4B, the two side walls of WP tip 72 define its width in the cross-track direction, which substantially defines the trackwidth (TW) of the data recorded in the RL of disk 16.

Figure 5:
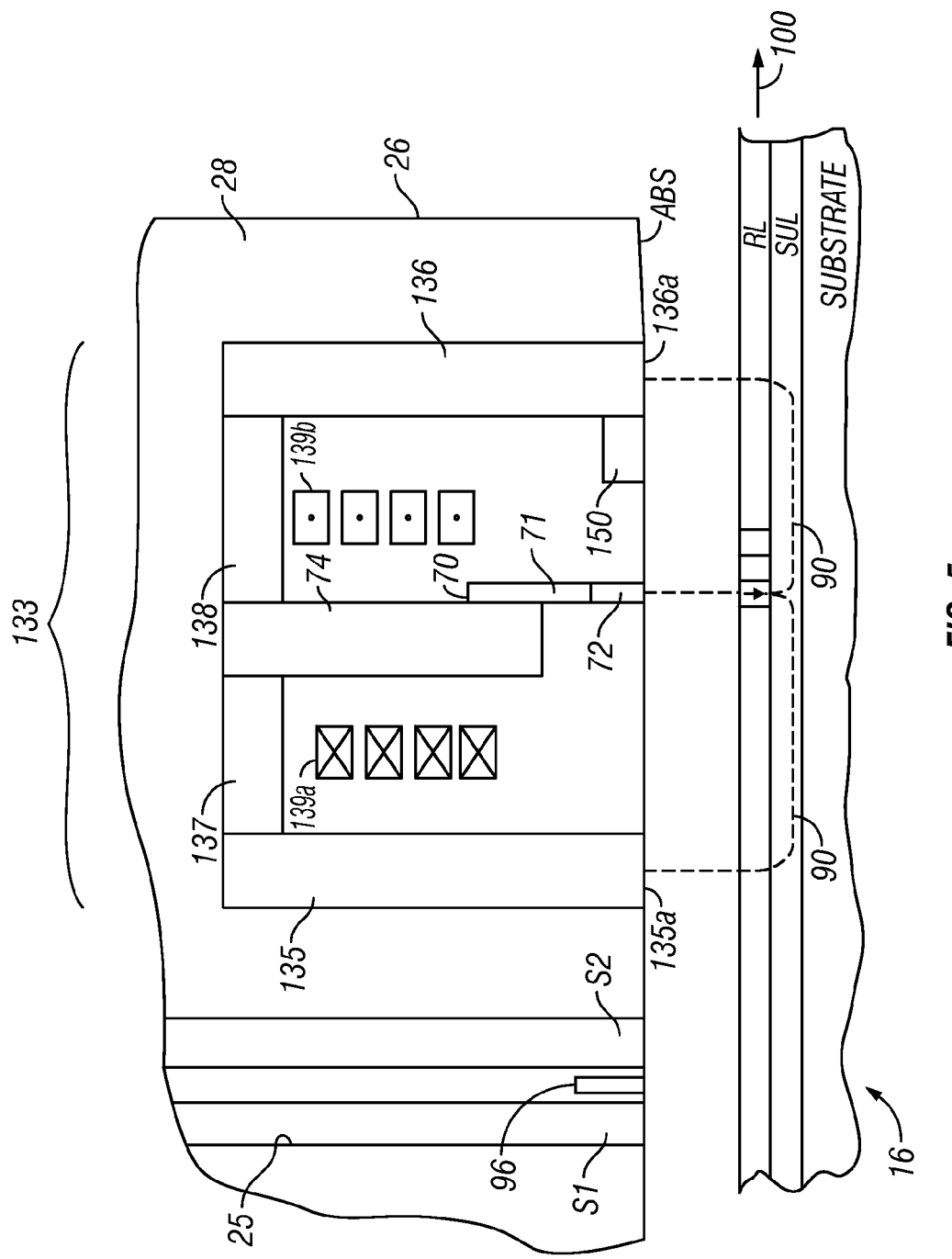
FIG. 5 is a side sectional view of a portion of a slider showing a read head, a prior art perpendicular write head with a helical coil, and a perpendicular magnetic recording disk.

The perpendicular write head of FIG. 4A has a "pancake" coil 79. FIG. 5 shows slider 28 with trailing surface 25, outer surface 26 and a read head 96 between shields S1, S2 like that in FIGS. 4A-4B, but wherein the perpendicular write head 133 has a thin film "helical" coil (shown with coil sections 139a, 139b) wrapped around the main pole 74. A perpendicular write head with a helical coil is described in US 2008/0186628 A1 assigned to the same assignee as this application. The write head 133 is formed on slider 28 having an outer surface 26 and also includes a yoke made up of the main pole 74, a shield layer 135, and connection stud 137 to the main pole 74. Pole 136 is the return path for the magnetic flux 90 and is connected to trailing shield 150, which may be part of a WAS. Return pole 136 has a yoke stud 138 that connects the return pole 136 to the main pole 74. A flared WP 70 is part of the main pole 74 and has a flared portion 71 and a WP tip 72 like that shown in FIGS. 4A-4B. Write current through coil 139a, 139b induces a magnetic field (shown by dashed line 90) from the WP 70 that passes through the RL (to magnetize the region of the RL beneath the WP tip 72), through the flux return path provided by the SUL, and back to the return pole 136. The end of WP tip 72 is located substantially at the ABS, and the return pole 136 has an end 136a that is located substantially at the ABS and thus generally coplanar with end WP tip 72.

In this invention a spin torque oscillator (STO) is used to inject magnetic flux into the main pole at an angle, preferably substantially orthogonal, to the primary axis of the main pole. The write flux from the main pole flows in a direction perpendicular to the ABS, either toward or away from the RL, depending on the direction of write current in the main coil. The auxiliary orthogonal field from the STO injects additional flux non-parallel to the primary magnetization of the main pole, which exerts a relatively large torque on the magnetization of the main pole, thereby facilitating magnetization reversal of the main pole. The basic concept of the invention is shown in FIG. 6, which illustrates the main coil (MC) and main pole with write flux directed perpendicular to the RL of the disk and the STO with auxiliary flux directed through a flux guide at an angle (greater than 15 degrees) and preferably substantially orthogonal (70 to 90 degrees) to the main pole.

The STO includes electrodes 101, 102, a pinned ferromagnetic layer 104 having its magnetization direction pinned or fixed, a free ferromagnetic layer 106 having its magnetization 107 free to rotate, and a nonmagnetic spacer layer 108 between the pinned ferromagnetic layer 104 and free ferromagnetic layer 106. The pinned layer 104 may have its magnetization 105 direction pinned by being exchange-coupled to an antiferromagnetic layer or pinned by a hard magnetic layer such as CoPtCr magnetic layer. The ferromagnetic layers 104, 106 are typically formed of Co, Fe or Ni, one of their alloys, or a multilayer of these materials, such as a CoFe/NiFe bilayer, and the nonmagnetic spacer layer 108 is typically formed of Cu, but may also be formed of other materials like Au, Ag and Cr. In FIG. 6, the free ferromagnetic layer 106 is oriented with its plane substantially parallel to the main pole of the write head. A flux guide 110 is coupled to the free layer 106 and directs flux from the free layer 106 substantially orthogonal to the main pole. The flux guide 110 may be formed of the same high-moment material used in conventional write poles. The layers making up the STO are formed on the slider body after the main pole and MC are formed, using conventional deposition and lithographic techniques well-known in the fabrication of thin film read/write heads.

Figure 6:
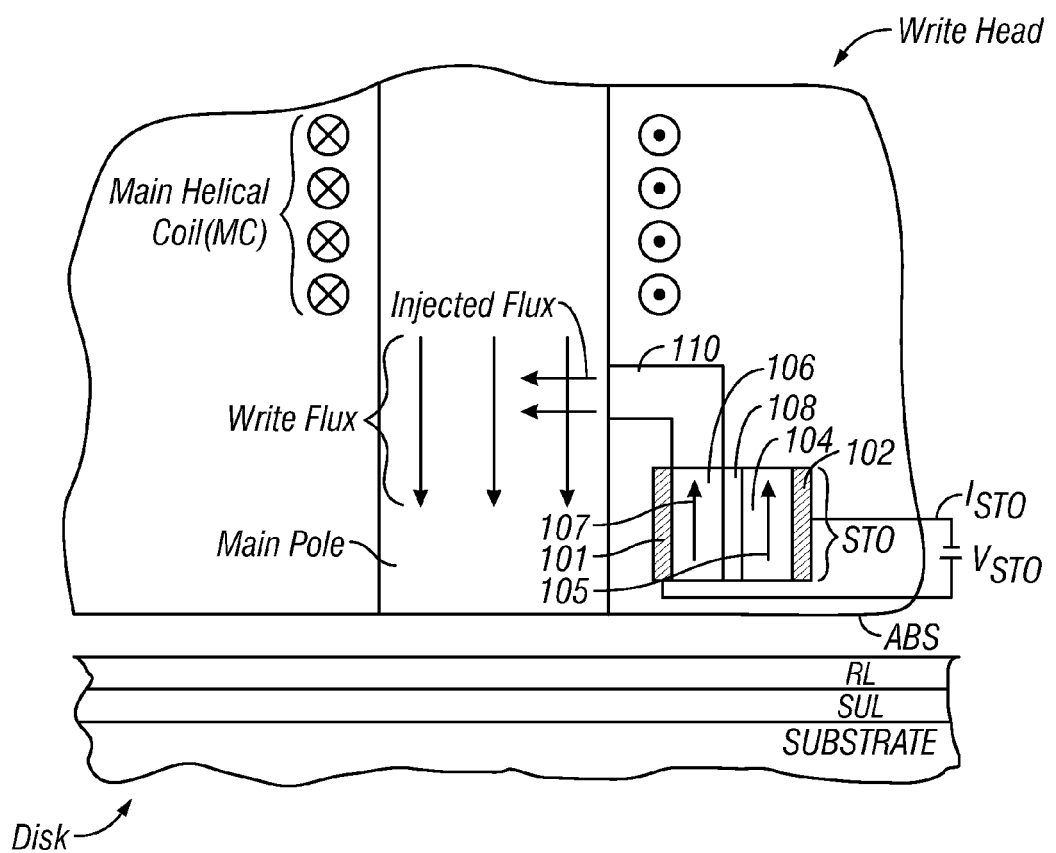
FIG. 6 is a schematic illustrating the basic concept of the invention showing a main coil (MC) with main pole, a spin torque oscillator (STO) with its free layer oriented substantially parallel to the main pole, and a flux guide for directing flux from the STO free layer to the main pole in a direction substantially orthogonal to the man pole.

The STO illustrated in FIG. 6 has a structure similar to a conventional current-perpendicular-to-the-plane (CCP) magnetoresistive read head. CCP MR read heads are well-known and described, for example, in U.S. Pat. No. 7,450,350 B2, assigned to the same assignee as this application. However, unlike in a CCP MR read head, in a STO a direct current ($I_{STO}$) with a current density above a critical value is applied across the electrodes 101, 102 to induce a spin torque on the magnetization 107 of the free ferromagnetic layer 106. The direct current $I_{STO}$ transfers spin angular momentum from the pinned layer 104 to the free layer 106 to induce precession of the magnetization 107 of the free layer 106. The frequency of precession depends on the properties and thicknesses of the materials making up the STO but for a specific STO the frequency of precession is a function of the value of $I_{STO}$. US 2008/01377224 A1 describes this type of STO to generate a high-frequency auxiliary field to the recording layer to assist writing. In the STO of FIG. 6, the magnetization 105 of pinned layer 104 is generally parallel to the magnetization 107 of free layer 106, but the magnetization 105 may also be pinned in a direction generally orthogonal to the magnetization 107 of the free layer 106, like that shown in US 2008/01377224 A1.

In the STO of FIG. 6 the magnetization 107 of free layer 106 in the absence of $I_{STO}$ is oriented in the plane of layer 106. However, the magnetization 107 may be oriented generally orthogonal to the plane of layer 106. This type of STO, also for write assistance of the recording layer, is described in US 2008/0019040 A1 and the related publication by Zhu et al., "Microwave Assisted Magnetic Recording", *IEEE Transactions on Magnetics*, Vol. 44, No. 1, January 2008, pp. 125-131. In this type of STO, the free layer is a field generation layer (FLG) exchange-coupled to a layer with perpendicular anisotropy (PL), wherein the FGL, PL and the pinned or reference layer have their planes oriented orthogonal to the plane of the recording layer, and the pinned or reference layer has its magnetization oriented perpendicular to the planes of the FGL and PL.

Figure 7:
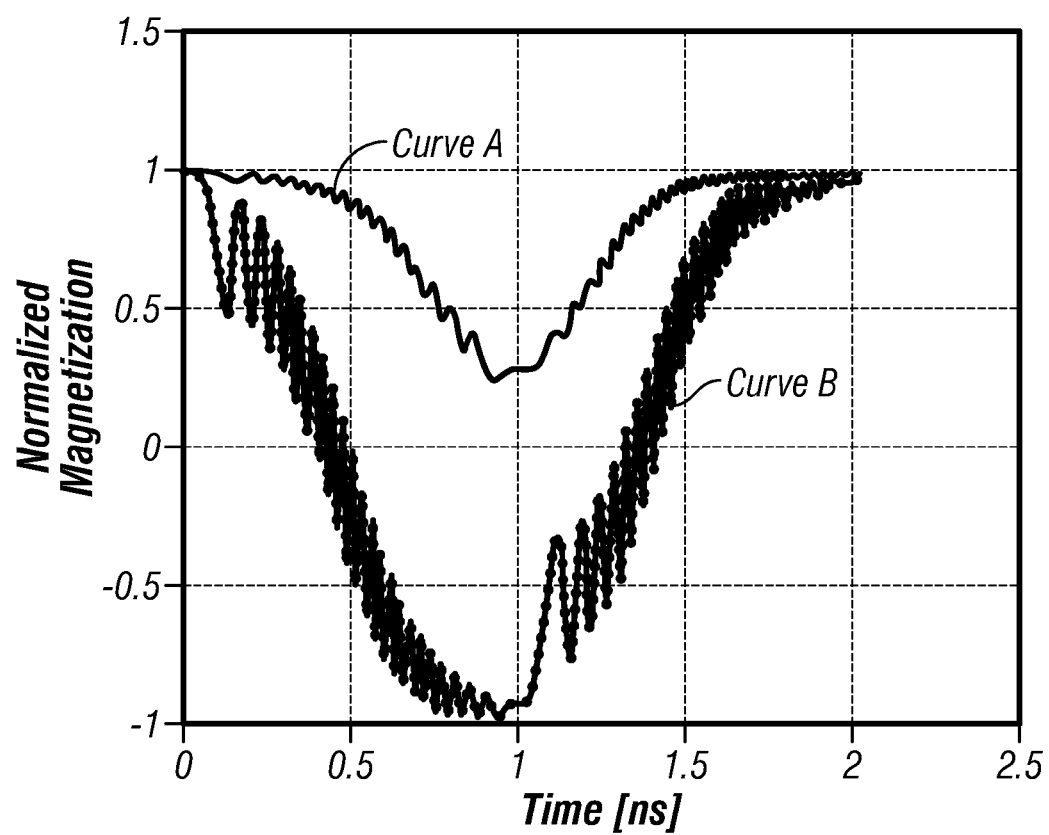
FIG. 7 is a graph of a computer-generated micromagnetic simulation of the magnetization reversal of a cylindrical magnetic nanostructure representing the write pole with (Curve B) and without (Curve A) an auxiliary orthogonal field.

A computer simulation has established that the time required for flux reversal in the main pole, which directly relates to data rate performance, is significantly reduced with this invention. This reduced switching time, or increased write head switching speed, thus allows for a disk drive with an increased data rate. FIG. 7 shows the computer-generated micromagnetic simulation of the magnetization reversal of a cylindrical magnetic nanostructure representing the write pole. The nanostructure has a diameter D=8 nm and a height h=10 nm. At time t=0, the nanostructure has a normalized magnetization of +1. Curve A shows the attempt to reverse the magnetization to −1 by applying a field parallel to the height of the nanostructure at a frequency of 0.5 GHz. As shown by Curve A, the magnetization is not switched but only reduced to about +0.3 after about 1 ns. Curve B shows the result when the same parallel field is applied together with an auxiliary field orthogonal to the height of the nanostructure. The orthogonal auxiliary field had an amplitude equal to 20% of the amplitude of the parallel field and was applied at a frequency of 1.0 GHz, twice the frequency of the parallel field. As shown by Curve B the magnetization is completely switched to −1 after about 0.8 ns. Additional simulations at different frequencies for the auxiliary orthogonal field show that higher frequencies improve the switching time even further. For example at a frequency of 6.5 GHz for the auxiliary orthogonal field, the magnetization is switched to −1 in about 0.5 ns.

Thus it has been determined that switching of the write pole magnetization benefits from the application of an orthogonal auxiliary magnetic field from the STO with the improvement depending on the frequency of the auxiliary field. As is well known in the art, ferromagnetic materials absorb applied magnetic fields more efficiently at or near their ferromagnetic resonance frequency, as described in Kittel C., "On the Theory of Ferromagnetic Resonance Absorption", *Phys. Rev.* 73, p. 155-161 (1948). Accordingly, the frequency of the auxiliary magnetic field from the free layer 106 of the STO can be selected to be preferably within a range near the ferromagnetic resonance of the magnetic material making up the write pole, which generally implies a frequency higher than the frequency of the main write field. The frequency of the auxiliary field from the STO is the frequency of precession of the magnetization 107 and, for a specific STO, is a function of the value of direct current ($I_{STO}$) applied across terminals 101, 102. Thus, for example, the $I_{STO}$ current range can be from the µA to the low mA range, and the current density then determines the STO frequency, which can be from about 2 to 20 GHz.

Ferromagnetic resonance in the write pole arises from the precession motion of the magnetic material of the write pole in the presence of the auxiliary magnetic field from the STO. The auxiliary magnetic field from the STO puts a torque on the magnetization of the magnetic material of the write pole which causes the magnetic moment to precess. The resonant frequency of the ferromagnetic precession depends on the material properties, including magnetic anisotropy and moment density and the shape of the magnetic structure. For example, for material used as write poles in conventional disk drive write heads, the ferromagnetic resonance frequency is typically in the range of about 1-4 GHz. However, auxiliary fields with frequencies lower than the ferromagnetic resonance frequency will also contribute to the switching of the magnetization of the write pole when applied at appreciable angles relative to the main direction of the magnetic anisotropy of the write pole. If the auxiliary field is at a frequency less than the ferromagnetic resonance frequency, the beneficial effect of the auxiliary field on the switching of the magnetization of the write pole will be dominated by the increase of the magnetic reversal torque in proportion to $\sin(\theta)$, where $\theta$ is the angle between the local direction of the total field from the main coil and the free layer of the STO and the local direction of the magnetization of the write pole. The proportionality of the magnetic torque to $\sin(\theta)$ also explains why the auxiliary field is useful not only at angles of 90 degrees but at lesser angles, preferably in the range of 15 to 90 degrees, relative to the write pole.

Figure 8A:
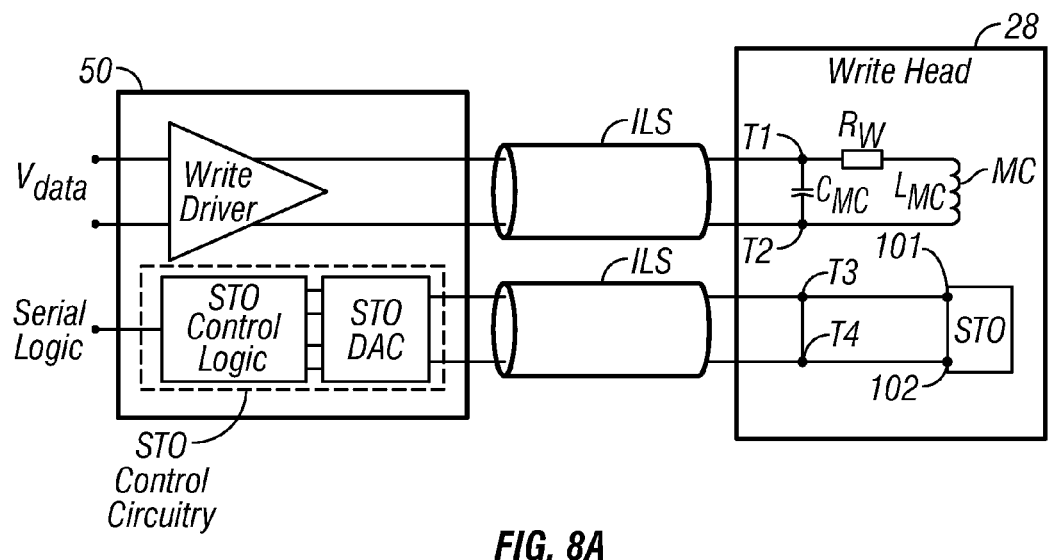
FIG. 8A shows an embodiment of the electrical circuitry connected to the main coil (MC) and the STO with separate interconnect lines according to the invention.

FIG. 8A shows an embodiment of the electrical circuitry connected to the main coil (MC) and the STO to generate the auxiliary flux. The write driver circuitry is in the read/write integrated circuit of chip 50 (FIG. 1) that is located away from the slider 28, typically on the E-block 24 (FIG. 1). The write driver is connected via interconnect lines on the integrated lead suspension (ILS) to the MC at terminals T1, T2 on the slider 28. The write head has a resistance $R_w$, the MC has an inductance $L_{MC}$, and the term $C_{MC}$ represents the parasitic capacitance. In the embodiment of FIG. 8A, a STO control circuit is located in the circuitry of chip 50 as an independent signal source. The STO control circuit is connected to the STO via interconnect lines separate from the interconnect lines between the write driver and the MC, but also located on the ILS. The STO electrodes 101, 102 (FIG. 6) are connected to terminals T3, T4, respectively, on slider 28. The STO control circuitry includes two circuit blocks, a STO control logic (STO-CL) and a STO control digital-to-analog converter (STO-DAC). The STO-CL may be a serial port logic receiver that receives logic signals that are stored in a digital register. The digital register values are then converted into analog signals by the STO-DAC. The analog output of the STO-DAC sets the STO voltage $V_{STO}$, which sets the value of $I_{STO}$, which determines the STO frequency, i.e., the frequency of precession of the magnetization 107 of the STO free layer 106 (FIG. 6).

Figure 8B:
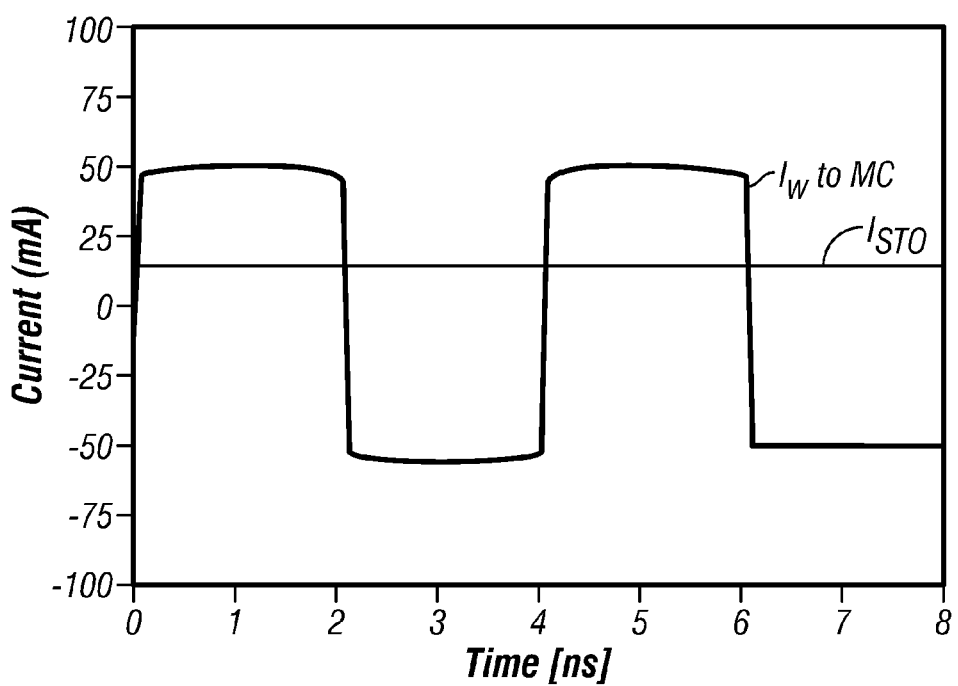
FIG. 8B is a graph of the write current ($I_w$) to the MC and the direct current ($I_{STO}$) to the STO for the circuitry embodiment of FIG. 8A.

FIG. 8B is a graph of the write current ($I_w$) to the MC and the direct current $I_{STO}$ to the STO. In this example, the write current is depicted as switching from +50 mA to −50 mA at a frequency of 250 MHz, which corresponds to a maximum data rate of 500 Mb/sec. The auxiliary field from the STO has a frequency preferably greater than the maximum write frequency, preferably close to the ferromagnetic resonance frequency of the magnetic material of the write pole. Thus in this example the value of $I_{STO}$ sets the current density through the STO, which will cause the auxiliary field to have a frequency in the range of about 3 to 6 GHz.

While the write head and STO have been described with respect to a write head with a helical coil, as illustrated in FIG. 6, the invention is not limited by a specific write head structure. Thus the invention may be implemented in a write head with a pancake coil, like the head depicted in FIGS. 4A-4B.

Figure 9:
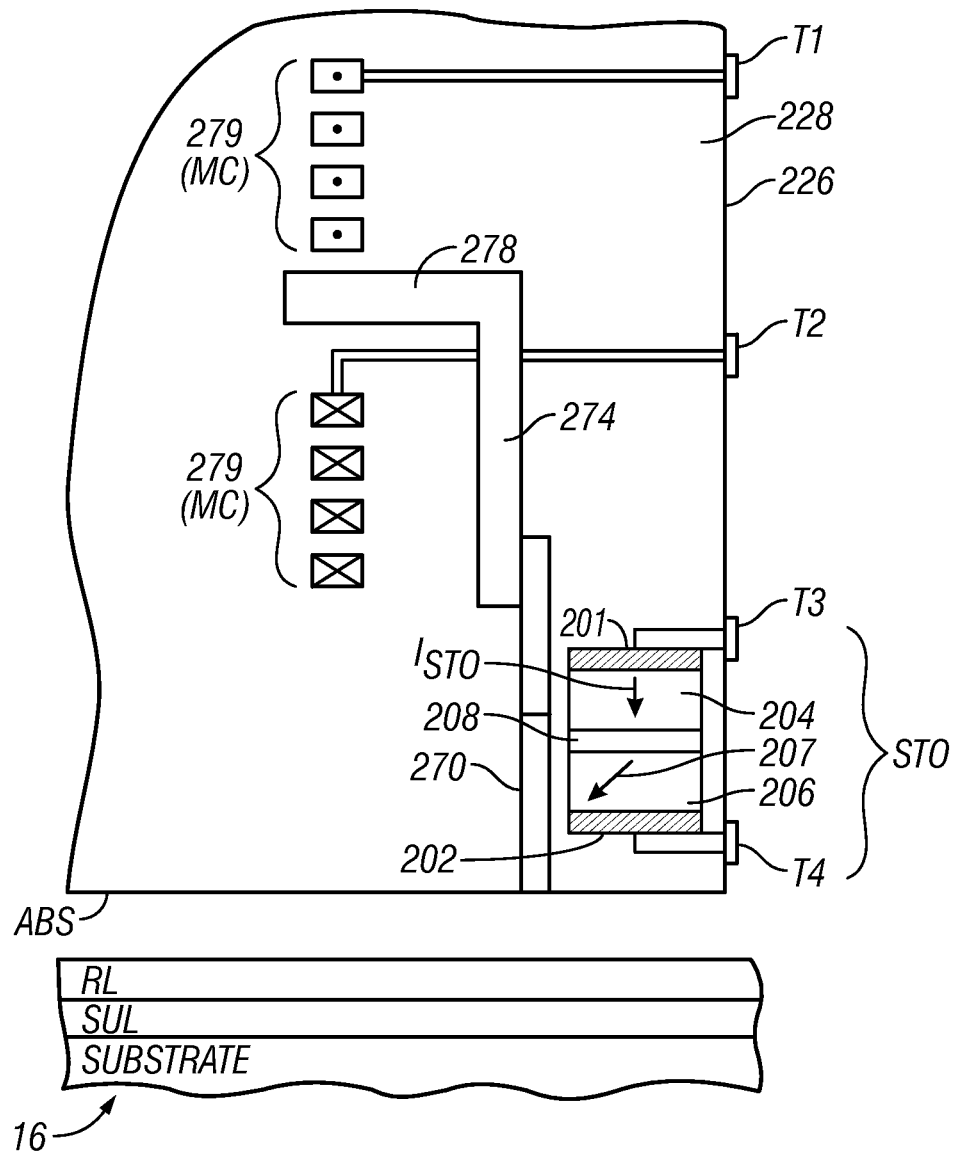
FIG. 9 shows an embodiment of the invention with the write head main coil (MC) and main pole, and a spin torque oscillator (STO) with its free layer oriented substantially orthogonal to the main pole.

Additionally, the invention may be implemented without a flux guide. FIG. 9 shows an embodiment of the write head of the invention as a modification of a write head with a pancake coil. In the side sectional view of FIG. 9, the write head includes a yoke 278 connected to main pole 274 with write pole 270, and a pancake coil 279 as the main coil (MC) shown as sections wrapped around yoke 278. The coil 279 is connected to terminals T1 and T2 on the outer surface 226 of slider 228. In this embodiment the STO is oriented with its layers orthogonal to the write pole 270. The STO layers include electrodes 201, 202, pinned ferromagnetic layer 204, spacer layer 208, and free ferromagnetic layer 206. The electrodes 210, 202 are connected to terminals, T3, T4, respectively, on outer surface 226. The free ferromagnetic layer 206 may have its magnetization in the plane of the layer or perpendicular to the plane of the layer in the absence of $I_{STO}$. When the $I_{STO}$ is injected into the STO the magnetization 207 precesses and auxiliary magnetic flux is directed generally orthogonally into the write pole 270 with a frequency corresponding to the precession frequency of the magnetization 107. While in FIG. 9 the write head and STO without a flux guide have been described with respect to a write head with a pancake coil 279, the invention may be implemented in a write head with a helical coil, like the head depicted in FIG. 6. In such an embodiment the STO in FIG. 6 would be rotated 90 degrees so that the planes of the layers making up the STO are oriented generally orthogonal to the main pole.

Because in the embodiment of FIG. 9 the layers of the STO are oriented orthogonal to the layer of the write pole and to other layers of the write head that were deposited and patterned on the trailing surface of the slider, this embodiment cannot be fabricated in the conventional manner for making a conventional thin film read/write head. Rather, a trenching material process (TMP) would be utilized, such as a damascene process. The basic steps in creating a TMP for the STO structure include: 1) deposition of a dielectric layer such as alumina ($Al_2O_3$) on the write pole 270; 2) patterning the dielectric (etching); 3) deposition of material such as for the contacts and for the STO material; and 4) chemical-mechanical polishing (CMP) or planarization. As mentioned above, the STO would be a similar structure as described in U.S. Pat. No. 7,450,350 B2, but the orientation would be orthogonal to the write pole. In addition, the insulating layer between the write pole 270 and the STO will be the alumina, which is deposited after the write pole 270 is formed. With the STO having more than one layer, the TMP would include multiple passes to create the layered structure of the STO. The TMP steps are generally used in the integrated circuit industry, and an example of this process is described in the article by Kahng, A. B. et al., "Fill for Shallow Trench Isolation CMP", *Computer-Aided Design*, 2006. ICCAD '06. IEEE/ACM International Conference on 5-9 Nov. 2006 Page(s): 661-668.

Figure 10:
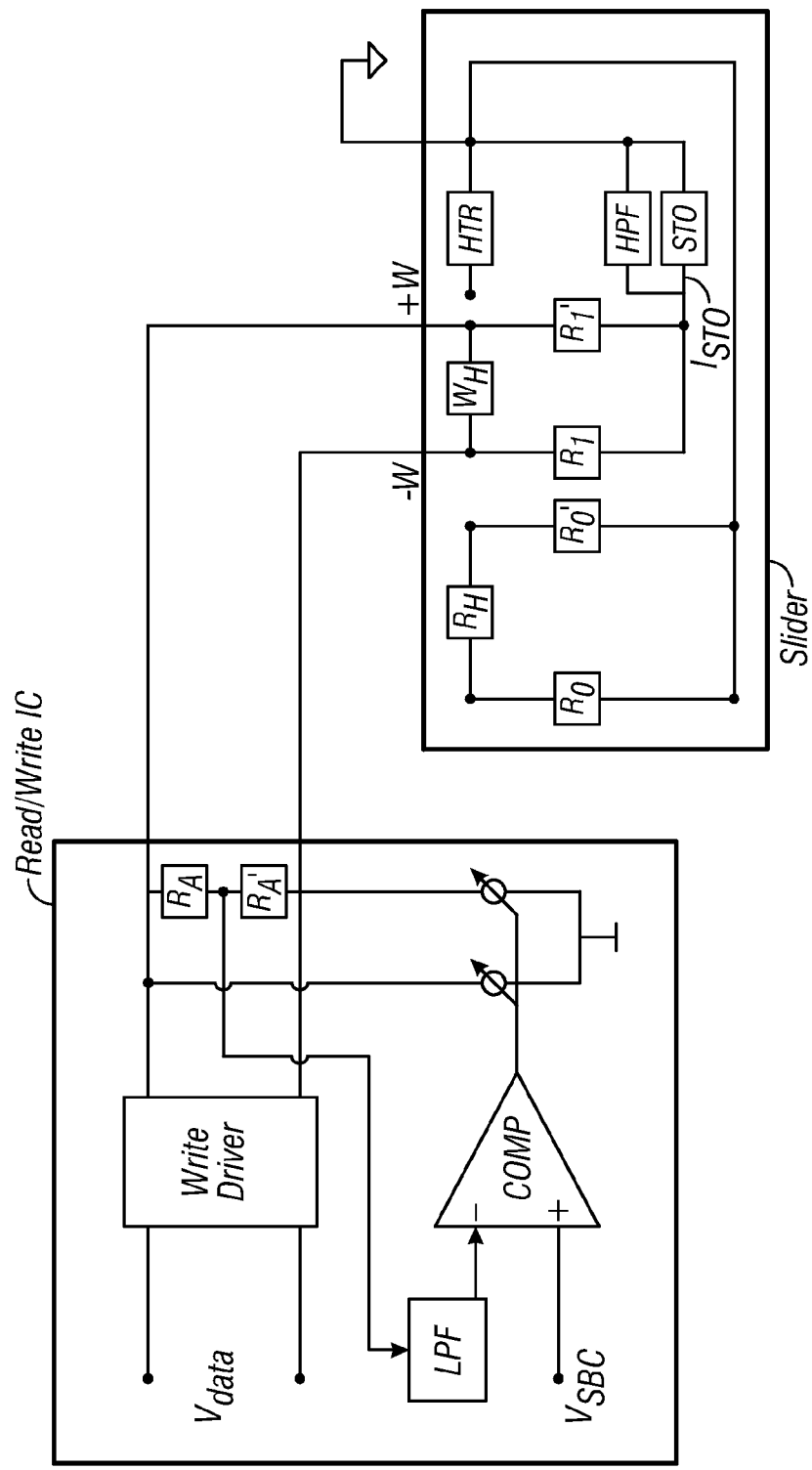
FIG. 10 shows an embodiment of the electrical circuitry connected to the write head (WH) and the STO where the $I_{STO}$ is supplied through the write lines to the WH and thus does not require separate interconnect lines.

FIG. 10 shows an embodiment of the electrical circuitry connected to the write head (WH) and the STO where the $I_{STO}$ is supplied through the write lines +W and −W to the WH and thus does not require separate interconnect lines. The write driver and STO control circuitry are located on the read/write integrated circuit (IC) chip. In addition, the $I_{STO}$ current can also be created by a low-frequency voltage source ($V_{SBC}$) that does not inhibit the high-frequency signals of the STO. The STO control circuitry includes a common-mode voltage feed through the write lines +W and −W that biases the STO. The circuitry of FIG. 10 operates by sensing the common-mode through the resistors $R_A$ and $R_A'$, which are closely matched in resistance and high in value, such that a very small amount of the write current signal is shunted away from the signal path. The common-mode voltage is then filtered by the low-pass filter (LPF) and compared with the $V_{SBC}$ voltage at the comparator (COMP). The control feedback then imposes the $V_{SBC}$ voltage on the common-mode of lines +W and −W. Similarly at the slider, resistors R1 and R1' sense the common-mode at the receiver and a high-pass filter (HPF) shunts the high-frequency signal content away from the STO, thereby placing the $V_{SBC}$ across the STO. The read head (RH) and a heater (HTR) are also shown formed on the slider.

Figure 11:
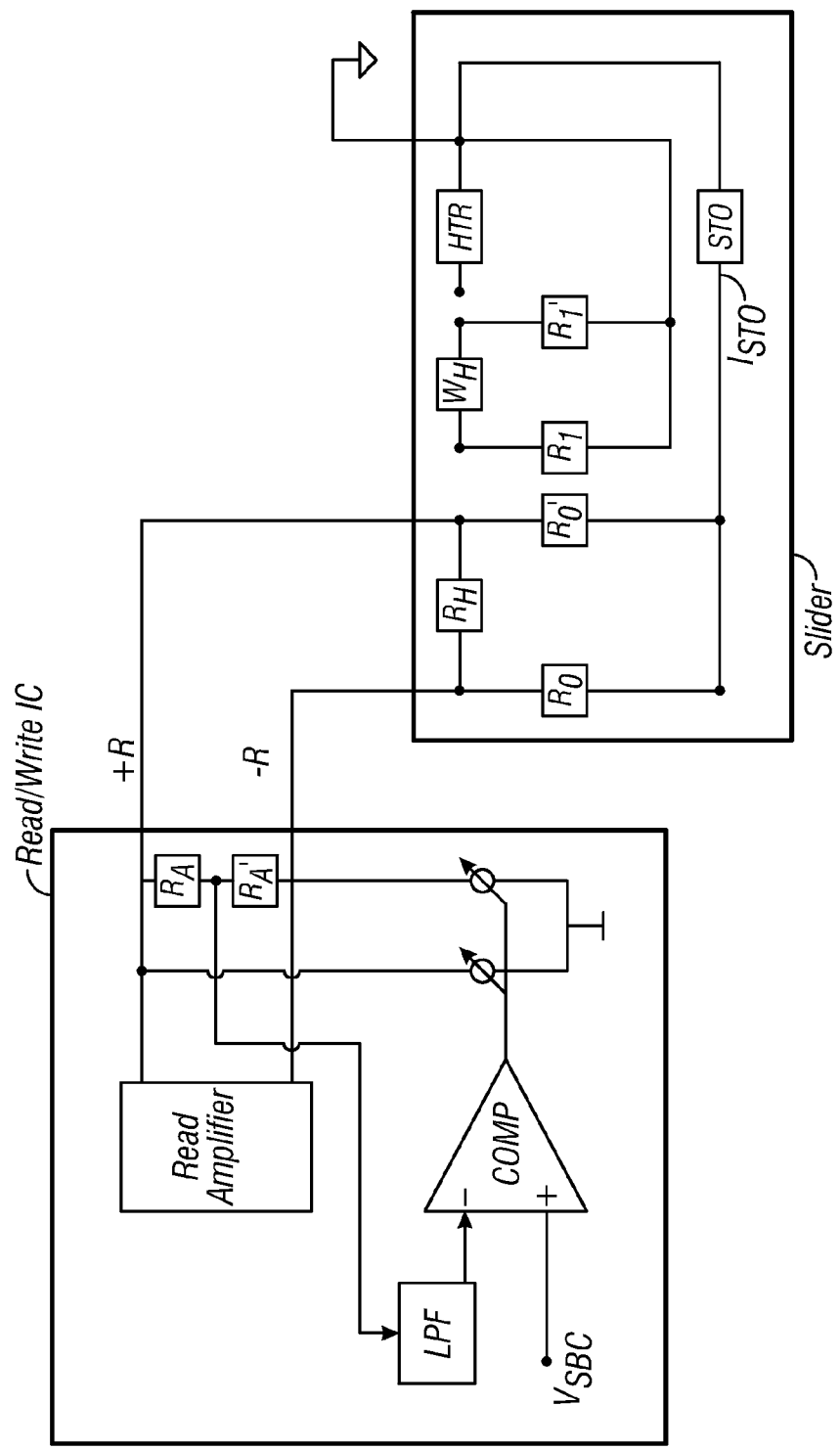
FIG. 11 shows an embodiment of the electrical circuitry where the $I_{STO}$ is supplied through the read lines to the read head (RH) and thus does not require separate interconnect lines.

FIG. 11 shows an embodiment of the electrical circuitry where the $I_{STO}$ is supplied through the read lines +R and −R to the read head (RH) and thus does not require separate interconnect lines. The read amplifier and STO control circuitry are located on the read/write integrated circuit (IC) chip. The STO control circuitry includes a common-mode voltage feed through the read lines +R and −R that biases the STO. The circuitry of FIG. 11 operates in a similar manner as FIG. 10 by sensing the common-mode through the resistors $R_A$ and $R_A'$, which are closely matched in resistance and high in value, such that a very little of the read head's bias current is shunted away from the signal path. The common-mode voltage is then filtered by the low-pass filter (LBF) and compared with the $V_{SBC}$ voltage at the comparator (COMP). The control feedback then imposes the $V_{SBC}$ voltage on the common-mode of lines +R and −R. Similarly at the slider, resistors R0 and R0' sense the common-mode at the receiver, thereby placing the $V_{SBC}$ across the STO.

Figure 12:
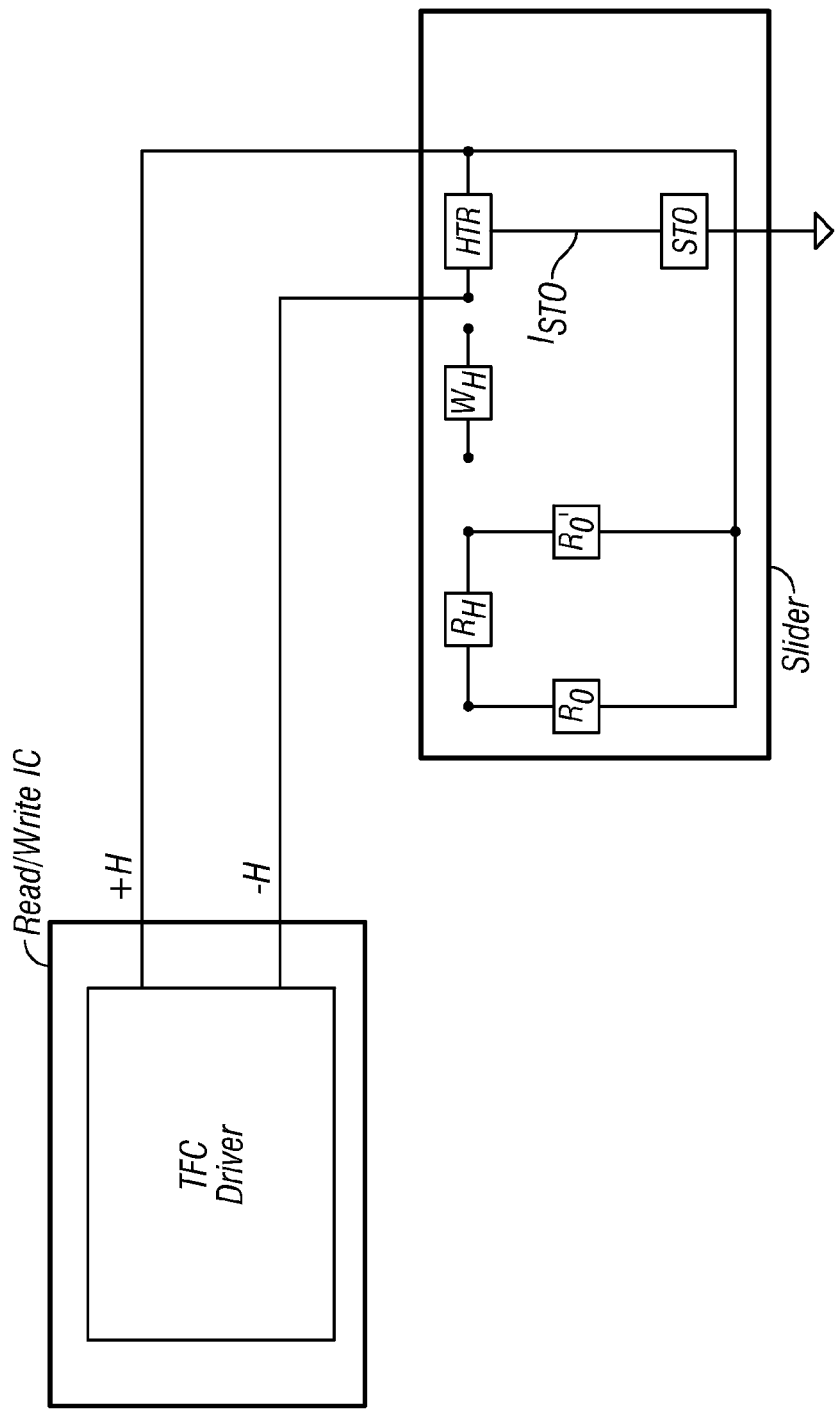
FIG. 12 shows an embodiment of the electrical circuitry for a hard disk drive that has thermal fly-height control (TFC) and where the $I_{STO}$ is supplied through the TFC lines to the heater (HTR) and thus does not require separate interconnect lines.

FIG. 12 shows an embodiment of the electrical circuitry for a hard disk drive that has thermal fly-height control (TFC) and where the $I_{STO}$ is supplied through the TFC heater lines +H and −H to the heater and thus does not require separate interconnect lines. Disk drives with TFC are well-known and use an electrically-resistive heater (HTR) located on the slider near the RH and WH. When current is applied to the heater the heater expands and causes the heads to expand and thus move closer to the disk surface during reading and/or writing. A disk drive with TFC and a method for controlling the heater is described in U.S. Pat. No. 7,375,914 B1, assigned to the same assignee as this application. The STO control circuitry includes placing the $V_{SBC}$ voltage on the low line of the TFC bias line. Here, an auxiliary ground connection from the STO may be required, such that the STO is biased between the low line of the TFC and ground of the system.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A perpendicular magnetic recording disk drive:
   a disk having a perpendicular magnetic recording layer;
   a write head for magnetizing regions of the recording layer comprising
      a main pole;
      a main electrically conductive coil coupled to the main pole for generating magnetic flux in the main pole in the presence of electrical write current; and
      a spin torque oscillator (STO) having first and second electrodes and a free ferromagnetic layer between the electrodes, the free layer having a magnetization free to rotate in the presence of an electrical current between the electrodes, the rotation of the free layer magnetization generating an auxiliary magnetic flux directed to the main pole at an angle to the main pole greater than 15 degrees and less than or equal to 90 degrees;

a write driver capable of supplying write current in two directions to the main coil;

a read head for detecting magnetized regions in the recording layer and generating a readback signal;

a read amplifier for amplifying the readback signal from the read head;

an integrated lead suspension (ILS) having electrically conductive traces connecting the write driver to the write head and electrically conductive traces connecting the read amplifier to the read head;

STO control circuitry for supplying direct electrical current to the STO electrodes when write current is supplied to the main coil, the STO circuitry being connected to the STO via traces connecting the write driver to the write head; and a pair of matched resistors between the write driver and the write head; and wherein the STO control circuitry includes a low-pass filter coupled to the common-mode through the resistors, a voltage source, and a comparator for comparing the output of the low-pass filter to the voltage source.

2. The disk drive of claim 1 further comprising an electrically resistive heater for moving the write head and read head toward the recording layer and heater control circuitry for supplying electrical current to the heater, and wherein the ILS includes electrically conductive traces connecting the heater control circuitry to the heater.

3. The disk drive of claim 2 wherein the STO circuitry directs electrical current to the STO electrodes via said traces connecting the heater control circuitry to the heater.

4. The disk drive of claim 1 further comprising a high-pass filter coupled to the STO for shunting high-frequency signal content away from the STO.

5. A perpendicular magnetic recording disk drive:

a disk having a perpendicular magnetic recording layer;

a write head for magnetizing regions of the recording layer comprising a main pole and a main electrically conductive coil coupled to the main pole for generating magnetic flux in the main pole in the presence of electrical write current;

a write driver for supplying electrical write current in two directions to the main coil of the write head;

electrically conductive traces connecting the write driver to the main coil of the write head;

a spin torque oscillator (STO) comprising first and second electrodes, a pinned ferromagnetic layer having a magnetization fixed in the presence of a direct electrical current between the electrodes, a free ferromagnetic layer having a magnetization free to rotate in the presence of a direct electrical current between the electrodes, and a nonmagnetic spacer layer between the pinned and free layers, wherein the pinned, spacer and free layers are located between the first and second electrodes and an edge of the free layer is magnetically coupled to the main pole of the write head;

STO control circuitry for supplying direct electrical current to the STO electrodes through the traces connecting the write driver to the main when write current is supplied to the main coil by the write driver; and a pair of matched resistors between the write driver and the main coil of the write head; and wherein the STO control circuitry includes a low-pass filter coupled to the common-mode through the resistors, a voltage source, and a comparator for comparing the output of the low-pass filter to the voltage source.

6. The disk drive of claim 5 further comprising a high-pass filter coupled to the STO for shunting high-frequency signal content away from the STO.

7. The disk drive of claim 5 wherein the STO free layer is oriented substantially orthogonal to the main pole.

8. The disk drive of claim 5 wherein the STO free layer is oriented substantially parallel to the main pole and further comprising a flux guide between the free layer and the main pole for directing magnetic flux from the free layer to the main pole.

9. The disk drive of claim 5 wherein the main coil is a helical coil wrapped around the main pole.

\* \* \* \* \*

UNITED STATES PATENT AND TRADEMARK OFFICE
CERTIFICATE OF CORRECTION

| | |
|---|---|
| PATENT NO. | : 8,351,155 B2 |
| APPLICATION NO. | : 12/542682 |
| DATED | : January 8, 2013 |
| INVENTOR(S) | : John Thomas Contreras et al. |

It is certified that error appears in the above-identified patent and that said Letters Patent is hereby corrected as shown below:

In column 12, line 18, between the words "main" and "when", insert the word --coil--.

Signed and Sealed this
Twenty-sixth Day of February, 2013

Teresa Stanek Rea
*Acting Director of the United States Patent and Trademark Office*